United States Patent
Heikkinen et al.

(10) Patent No.: US 9,479,132 B2
(45) Date of Patent: Oct. 25, 2016

(54) SIGNAL CONVERSION WITH GAIN IN THE FORWARD PATH

(71) Applicant: Broadcom Corporation, Irvine, CA (US)

(72) Inventors: Jari Johannes Heikkinen, Espoo (FI); Jonne Juhani Riekki, Espoo (FI); Jouni Kristian Kaukovuori, Vantaa (FI)

(73) Assignee: BROADCOM CORPORATION, Irvine, CA (US)

(*) Notice: Subject to any disclaimer, the term of this patent is extended or adjusted under 35 U.S.C. 154(b) by 61 days.

(21) Appl. No.: 14/319,919

(22) Filed: Jun. 30, 2014

(65) Prior Publication Data

US 2015/0295554 A1 Oct. 15, 2015

Related U.S. Application Data

(60) Provisional application No. 61/979,812, filed on Apr. 15, 2014.

(51) Int. Cl.
| | |
|---|---|
| *H03B 19/00* | (2006.01) |
| *H03G 3/30* | (2006.01) |
| *H03D 7/14* | (2006.01) |
| *H03D 7/16* | (2006.01) |

(52) U.S. Cl.
CPC .......... *H03G 3/3042* (2013.01); *H03D 7/1441* (2013.01); *H03D 7/1458* (2013.01); *H03D 7/1466* (2013.01); *H03D 7/1483* (2013.01); *H03D 7/165* (2013.01)

(58) Field of Classification Search
CPC ....... H03D 7/12; H03D 7/125; H03G 3/3042
USPC ........ 327/113, 114, 116, 119, 355–358, 363, 327/590; 455/130, 205, 230, 232.1, 296, 455/311–313, 323, 334, 337
See application file for complete search history.

(56) References Cited

U.S. PATENT DOCUMENTS

| | | | |
|---|---|---|---|
| 8,798,570 B2* | 8/2014 | Fahim | H03G 3/3052 455/296 |
| 2011/0158346 A1* | 6/2011 | Ballantyne | H04B 1/525 375/296 |
| 2013/0109337 A1* | 5/2013 | He | H04B 1/28 455/256 |
| 2013/0149983 A1* | 6/2013 | Fahim | H03G 3/3052 455/326 |
| 2013/0281039 A1* | 10/2013 | Cathelin | H04B 1/16 455/234.1 |
| 2015/0063509 A1* | 3/2015 | Hedayati | H04B 15/005 375/350 |

* cited by examiner

*Primary Examiner* — William Hernandez
(74) *Attorney, Agent, or Firm* — Foley & Lardner LLP

(57) ABSTRACT

A system and method of frequency conversion or demodulation can be used in wireless environments. A demodulator or frequency converter can include a forward mixer path including an amplifier, a first mixer, a first input, a second input, and a first output. The forward mixer path can be configured to receive a first radio frequency signal at the first input, receive an oscillator signal at the second input and provide a baseband signal. The first mixer can configured to provide a gain.

20 Claims, 7 Drawing Sheets

SIGNAL CONVERSION WITH GAIN IN THE FORWARD PATH

CROSS-REFERENCE TO RELATED APPLICATIONS/INCORPORATION BY REFERENCE

This patent application claims the benefit of and priority to U.S. Provisional Application No. 61/979,812, filed on Apr. 15, 2014, entitled "SIGNAL CONVERSION WITH GAIN IN THE FORWARD PATH", assigned to the assignee of this application, and which is hereby incorporated by reference herein in its entirety.

FIELD OF THE DISCLOSURE

This disclosure generally relates to systems and methods for signal conversion or demodulation in radio frequency receivers. This disclosure relates to conversion or demodulation systems and methods with gain in the forward path.

BACKGROUND OF THE DISCLOSURE

Radio frequency receivers are used in a large number of different types of applications, including various communication and sensing applications. Communication and sensing applications can include, but are not limited to, those associated with stationary and mobile stations and equipment, access points (APs), mobile devices, positioning systems (e.g., the Global Positioning System (GPS)), cellular telephones, radars, modems, light sensors, heat sensors, targeting sensors, networks, etc. Such applications can utilize receivers operating within one or more of a number of different radio frequency (RF) bands.

Receivers can operate within any one or more of the following frequency bands: Global System for Mobile Communications (GSM) bands, 850, 900, 1800, and/or 1900, Wideband Code Division Multiple Access (WCDMA) bands, High Speed Packet Access (HSPA) bands and/or Long Term Evolution (LTE) bands 1, 2, 3, 802.11 bands, GPS bands, etc. The frequency bands listed above are exemplary and not listed in a limiting fashion. Receivers can be employed in any workstation, telephone, desktop computer, laptop, notebook computer, server, handheld computer, mobile telephone, other portable telecommunications device, media playing device, a gaming system, mobile computing device, sensor, radar, or any other type and/or form of sensing, computing, telecommunication or media device.

Radio receivers often utilize a converter or demodulator to process radio frequency signals. The converter or demodulator converts the radio frequency signal to a baseband (BB) signal (e.g., an analog baseband signal). Communication and sensing devices have employed direct conversion receivers comprised of at least one passive mixer that utilizes triode transistors. CMOS devices associated with the analog baseband signal can exhibit strong 1/f noise (also known as flicker noise).

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION OF EMBODIMENTS

Figure 1:
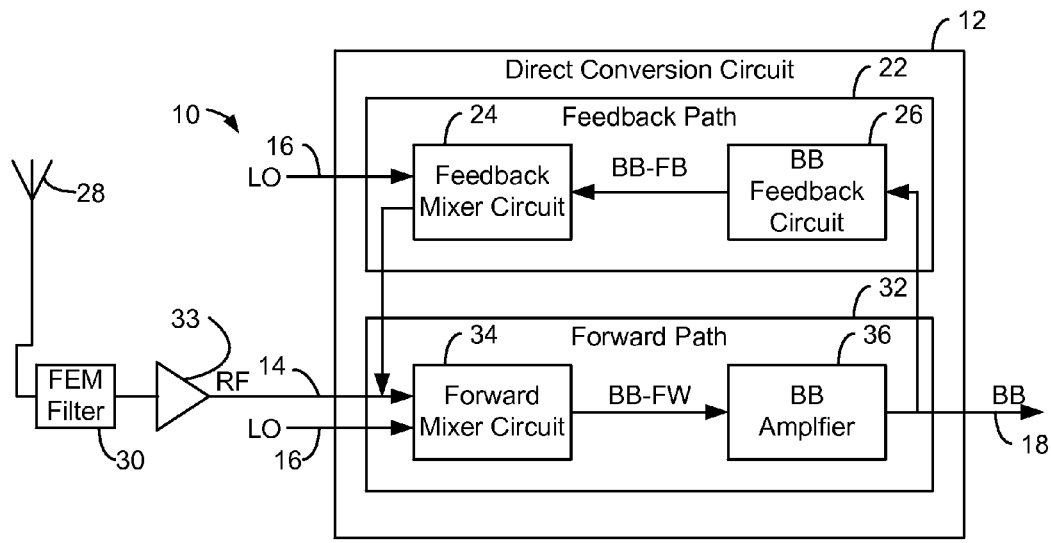
FIG. 1 is a general block diagram depicting an embodiment of a direct converter or demodulator for use in a communication or sensing device according to an embodiment.

According to one embodiment, the present methods and systems can reduce flicker noise contribution in a radio receiver. In one embodiment, a Cartesian topology for a direct frequency converter or modulator with flickerless passive sampling methods in forward path can reduce susceptibility to flicker noise contribution from analog baseband (BB) devices in the receiver chain. In one embodiment, the Cartesian topology can also enable one or more of: multipath filtering by forcing a high offset transmit signal to feedback path filtering, lower radio frequency impedance at the low noise amplifier output, relaxed design of the inductive-capacitive (LC) resonator, and/or relaxed design of common mode feedback of baseband stages because the feedback loop is fed through a radio frequency alternating current (AC) coupling (e.g., non-direct current (DC) coupling). In one embodiment, the noise contribution of cascaded blocks (e.g., amp circuitry) can be reduced directly (e.g., by the amount of added gain). Mixer topologies and switching functionalities can be chosen based upon desired path gain and desired impedance to implement the Cartesian topology of the direct converter or demodulator in one embodiment. The mixer topologies can use passive mixers operating with triode mode transistors in certain embodiments.

One embodiment relates to a demodulator including a forward mixer path and a feedback mixer path. The forward mixer path includes an amplifier, a first mixer, a first input, a second input, and a first output. The forward mixer path can receive a first radio frequency signal at the first input, receive an oscillator signal at the second input and provide a baseband signal. The first mixer can receive the oscillator signal, down convert the signal and provide a gain. The amplifier can receive the baseband signal and provide an output signal at the first output. The feedback mixer path can include a second mixer. The feedback mixer path can receive the output signal at the first output and provide a second radio frequency signal at the first input. The second mixer can receive the oscillator signal.

One embodiment relates to a method of processing a radio frequency signal. The method can include using a voltage mode mixer core in a forward mixer path to down convert the radio frequency signal to a baseband signal and provide a voltage gain. The method can also include using a feedback mixer path comprising a second mixer core to correct overall gain.

One embodiment relates to a frequency converter. The frequency converter can include an amplifier, a first mixer, a resistive-capacitive network, and a second mixer. The first mixer and the amplifier can be disposed between a first input and a first output. The second mixer and the resistive-capacitive network can be disposed between the first input and the first output, and the first mixer can provide open loop gain and frequency down conversion.

With reference to FIGS. 1-7, systems for and methods of processing received signals can be employed in a receiver 10. In one embodiment, receiver 10 includes a demodulator or direct conversion circuit 12. Receiver 10 can be used in any type of application, including, but not limited to, communication and sensing applications. Receiver 10 can be part of a communication, computing, sensing, media, entertain or a networking device in certain embodiments.

Receiver 10 can include an antenna 28, a front end module (FEM) filter 30 and a low noise amplifier (LNA) 33. Antenna 28 can receive a radio frequency signal which is provided through a front end module (FEM) filter 30 and low noise amplifier 33 to direct conversion circuit 12. Direct conversion circuit 12 can be part of one or more channels (e.g., an in phase channel or a quadrature phase channel) of receiver 10.

Circuit 12 can be provided in various locations in receiver 10 and can be provided in a single integrated circuit (IC) or IC package. In one embodiment, circuit 12 is provided in a processing stage between a radio frequency portion and baseband processing portion of receiver 10. Circuit 12 or components thereof can be part of a front end circuit (FEC), radio frequency integrated circuit (RFIC), or a baseband processing circuit in certain embodiments.

Direct conversion circuit 12 can be utilized to process the radio frequency signal received at an input 14. In one embodiment, the radio frequency signal is provided by low noise amplifier 33. Circuit 12 can convert the radio frequency signal provided at input 14 to a baseband signal provided at an output 18. In one embodiment, circuit 12 is configured with a Cartesian topology (e.g., as a Cartesian demodulator). The radio frequency signal can be at any radio frequency range and the baseband signal can include in-band (I) and quadrature (Q) components or other modulation components at a baseband frequency in one embodiment.

In one embodiment, circuit 12 uses a local oscillator (LO) signal provided at a local oscillator input 16 to directly convert the radio frequency signal (e.g., having a frequency range between 300 megahertz and 3 gigahertz for cellular communications) to the baseband signal (e.g., from several megahertz up to 100 megahertz in certain embodiments) at output 18. The local oscillator signals can be provided at various frequencies and phase delays depending on desired conversion operations, mixer topologies, switch functionalities, etc. For example, oscillator signals at 2 times the frequency of the local oscillator signal and oscillator signals having phase delays (e.g., 0°, 90°, 180°, 270°), can be used in receiver 12. The oscillator signal can have various duty cycles (e.g., 10% to 50%) and various phase delays (e.g., 0°, 45°, 90°, 135°, 180°, . . . 315°, etc.) to generate accurate switch control functionalities (e.g., for harmonic suppression and/or for reactive pass band functions).

In one embodiment, circuit 12 can advantageously increase open loop gain by utilizing voltage mode mixer core to provide voltage gain so that the noise contribution of baseband components can be reduced directly (e.g., by the amount of added gain). In one embodiment, circuit 12 provides a 6 dB or 9 dB voltage gain depending upon the sampling sequence and the amount of signal phases utilized. By having increased open loop gain in circuit 34, the noise contribution of amplifier circuit 36 can be reduced.

In one embodiment, mixer topologies and switching functionalities can be chosen to provide a voltage gain amount (e.g., more than 1 decibel (dB), between 6 dB and 9 dB or either 6 or 9 dB in certain embodiments) depending on the quality of sampling sequence and/or amount of signal phases utilized in the forward path. The mixer topologies also can provide impedance transformation. A very high feedback factor can be obtained in one embodiment. The phase delays, gain values and frequency ranges discussed above are listed in an exemplary, non-limiting fashion.

In one embodiment, circuit 12 includes a feedback path 22 and a forward path 32. Feedback path 32 includes a feedback path mixer circuit 24 and a baseband feedback circuit 26. Forward path 32 includes a forward mixer circuit 34 and a baseband amplifier circuit 36. Feedback mixer circuit 24 and forward mixer circuit 34 receive the local oscillator signal provided at input 16.

A radio frequency feedback signal from feedback mixer circuit 24 is provided to radio frequency input 14 which is coupled to forward mixer circuit 34. Forward mixer circuit 14 provides a baseband signal to baseband amplifier circuit 26. Baseband amplifier circuit 36 amplifies the baseband signal and provides an amplified baseband signal at output 18. Baseband feedback circuit 26 receives the amplified baseband at output 18 and provides a filtered baseband signal to feedback mixer circuit 24.

Feedback path 22 can provide a very high feedback factors in certain embodiments. If the added open loop gain in forward path 32 is significant (e.g., tens of dBs), the overall gain can be directly corrected by feedback mixer path 22 in one embodiment. The input impedance at input 14 (e.g., at the low noise amplifier-mixer interface of the forward path 34 and the feedback path 22) can be kept relatively low in one embodiment.

Converter circuit 12 can include separate components for a quadrature-phase channel and an in-phase channel in one embodiment. Single ended or differential inputs (e.g., inputs 14 and 16) and single ended or differential outputs (e.g., output 18) can be provided for each of channel (e.g., each of the quadrature-phase channel and in-phase channel). The connections or paths between components in paths 22 or 32 can be differential or single ended.

The radio frequency signal from antenna 28 can be provided by low noise amplifier 33. Antenna 28 can be an inductive-capacitive (LC) resonator (e.g., embodied as a radio frequency resonator). Amplifier 33 can be connected to a supply voltage of Vdd in one embodiment. The interface between circuit 34 and amplifier 36 in path 32 can be separately adapted to an amplifier (e.g., op amp) topology associated with circuit 36. In one embodiment, common-mode voltage criteria are relaxed because the baseband amplifier is not necessarily DC connected as in some op-amp configurations which are limited close to Vdd/2. In one embodiment, a 2/3 Vdd common-mode voltage at input port for an operational amplifier with an NMOS intake stage can be utilized.

Forward mixer circuit 34 includes down converter that down converts the radio frequency signal input 14 to a baseband signal in one embodiment. Feedback mixer circuit 34 includes an up converter that up converts the baseband feedback signal from baseband feedback circuit 26 to the frequency associated with the radio frequency signal in one embodiment.

Figure 2:
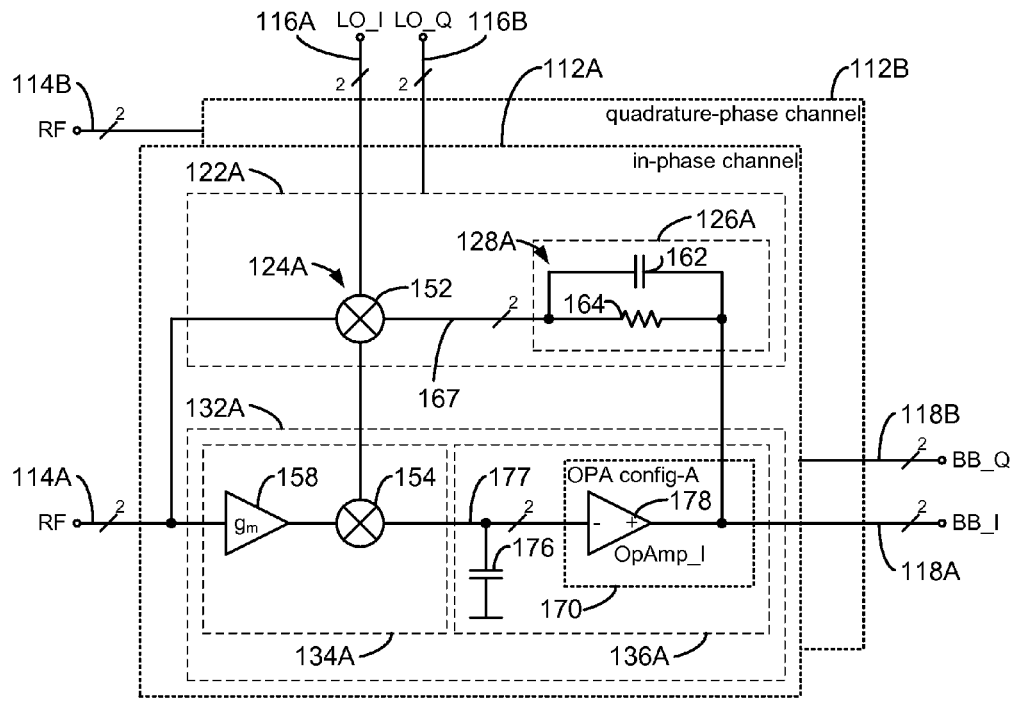
FIG. 2 is an electrical schematic drawing depicting the direct converter or demodulator illustrated in FIG. 1 according to an embodiment.

With reference to FIG. 2, demodulators or direct conversion circuit 12 is comprised of an in-phase channel circuit 112A and a quadrature-phase channel circuit 112B in one embodiment. In one embodiment, circuits 112A and 112B convert the radio frequency signals received at inputs 114A and 114B to a baseband in-phase signal at output 118A and a baseband Q signal at output 118B, respectively. The components of in-phase direct channel circuit 112A are discussed in detail below. Similar components are provided in quadrature-phase channel circuit 112B.

Circuit 112A includes a feedback path 122A and a forward path 132A. Path 122A includes a feedback mixer circuit 124A and a baseband feedback circuit 126A. Feedback mixer circuit 124A includes a mixer 152 coupled to a local oscillator input 116A, an output coupled to radio frequency input 114A, and an input coupled to a node 167. Mixer 152 can provide a 0 dB gain in one embodiment.

Baseband feedback circuit 126A can include a filter network 128A comprised of a capacitor 162 and a resistor 164. Baseband feedback can be provided from the output of a stage 178 through capacitor 162 and resistor 164 to mixer 152. Although filter network 128A is shown as a parallel capacitive-resistive network, other filtering devices and topologies can be utilized. Filter network 128A can be tuned for the appropriate baseband feedback characteristic.

Forward path 132A can include forward mixer circuit 134A and an amplifier circuit 136A. Circuit 134A can include a mixer 154 and a gain component 158. Although gain component 158 is shown as a separate component, gain component 158 can be part of or a quality of mixer 154. For example, a mixer topology or switching functionality for mixer 154 can be chosen to provide the gain associated with gain component 158. Mixer 154 can include an input coupled to local oscillator input 116A. Gain component 158 provides a voltage gain in one embodiment.

Amplifier circuit 136A includes a filter 176 and an amplifier circuit 170. Filter 176 can be a capacitor coupled between a node 177 (e.g., between stage 178 and mixer 152) and ground. Filter 176 serves to provide a path for high frequency blockers associated with local oscillator signals in one embodiment. Other topologies for filter 176 can be utilized.

Amplifier circuit 170 can be embodied as an operational amplifier circuit having stage 172 in one embodiment. Stage 172 can have an input coupled to mixer 154 and an output coupled to output 118A and baseband feedback circuit 126A in one embodiment. Stage 172 can be an inverting operational amplifier in one embodiment.

The feedback factor for path 122A can be very high. If the open loop gain of mixer 152 and gain component 158 is very high (e.g., ten dB), the overall gain can be corrected by filter network 128A.

In one embodiment, Cartesian feedback can utilize in practice an ideal DC block (e.g., basically DC connected and still separated). In one embodiment, the common mode voltage (Vcm) output for an operational amplifier can be different than the input at node 177. Instead of a Vcm input being equal to a Vcm output and approximately Vdd/2 or close to Vdd/2, the Cartesian feedback utilizing DC block at feedback can use depending on topology a Vcm input more or less than Vdd/2 and still provide a Vcm output equal to or approximately equal to Vdd/2 for rail-to-rail output signals in one embodiment.

Figure 3:
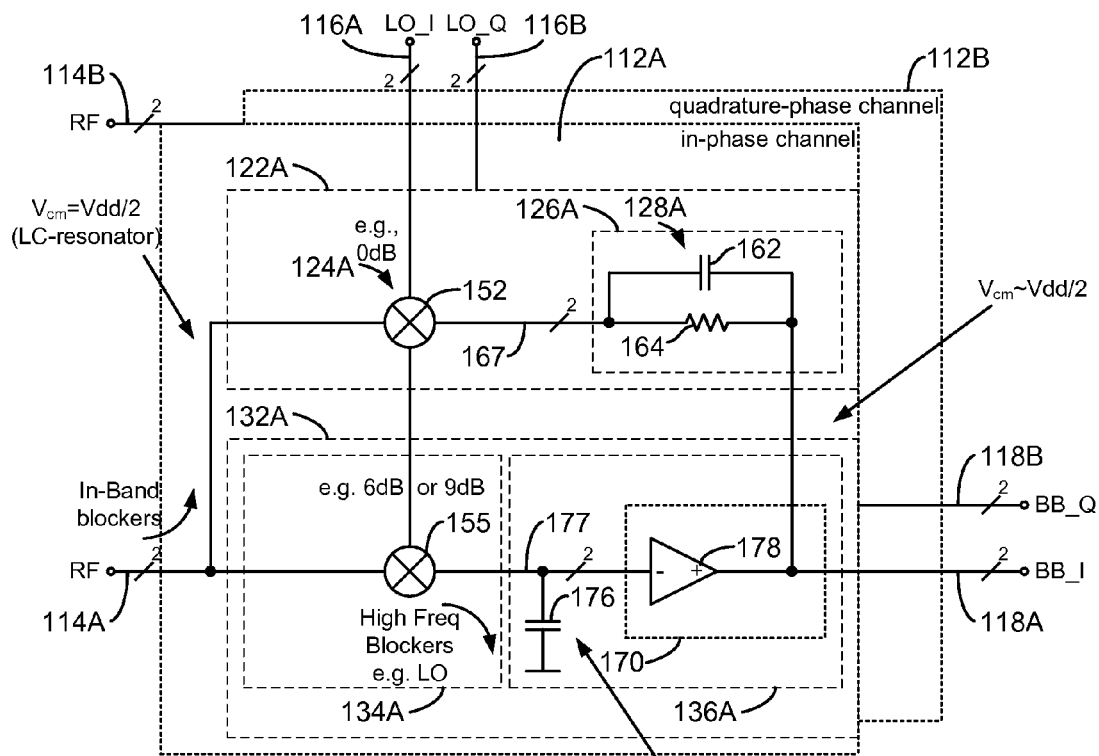
FIG. 3 is an electrical schematic drawing of the direct converter or demodulator illustrated in FIG. 1 according to another embodiment.

With reference to FIG. 3, certain aspects of in-phase channel circuit 112A are similar to circuit 112A described with reference to FIG. 2. Circuit 112A in FIG. 2 can include forward path 132A with a mixer 155 instead of mixer 154 and gain component 158 shown in FIG. 2. Mixer 155 can provide a 6 dB or 9 dB gain in certain embodiments. The 6 dB or 9 dB gain can be provided by choosing an appropriate mixer topology and switching topology as described below with reference to FIGS. 7 and 8. In one embodiment, the gain of mixer 155 without significant flicker noise is similar to the gain of low noise amplifier 33 discussed with reference to FIG. 1. In one embodiment, the input impedance at input 114A can be low. Other suitable gain values can be chosen based upon system parameters and design criteria.

Figure 4:
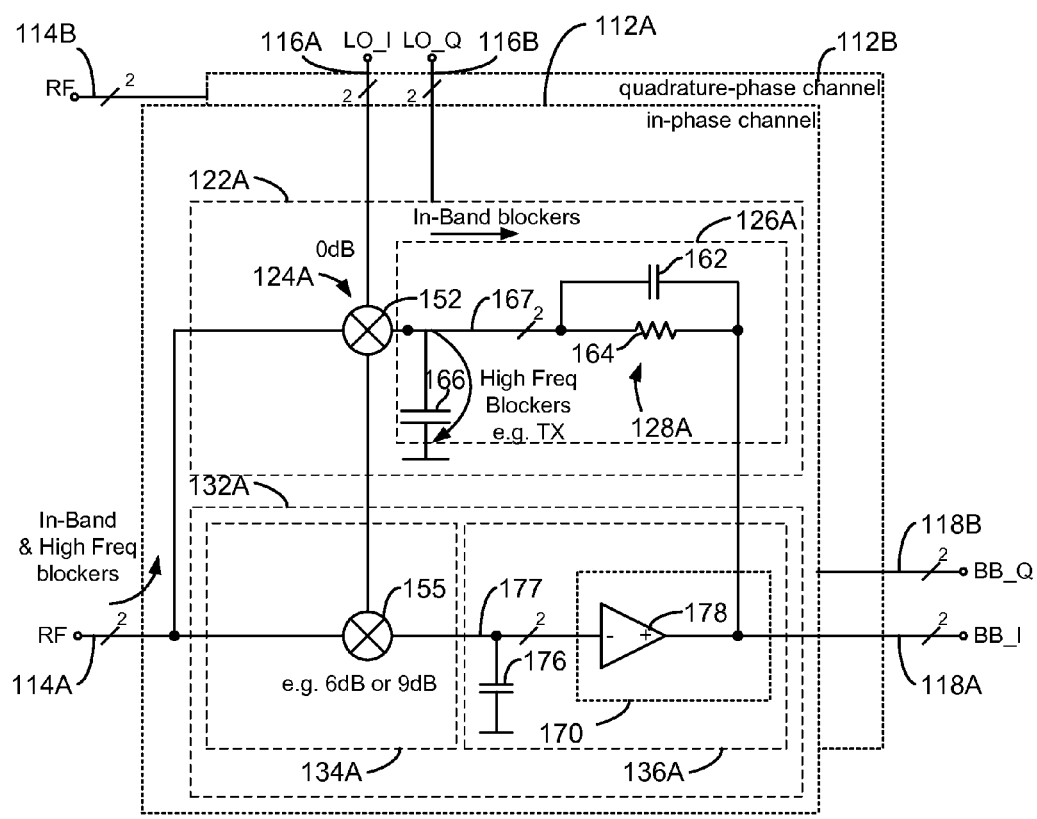
FIG. 4 is an electrical schematic drawing of the direct converter or demodulator illustrated in FIG. 1 according to another embodiment.

With reference to FIG. 4, demodulator or direct conversion circuit 112A is similar to circuit 112A described with reference to FIG. 3. Circuit 112A in FIG. 4 can include a filter 166 for removing high frequency blockers associated with the radio frequency signal. Filter 166 can be part of feedback circuit 126A in one embodiment. In one embodiment, circuit 112A does not include filter 176. In one embodiment, both filter 166 and 176 are included in circuit 112A. Filter 166 can be embodied as a capacitor disposed between node 167 and ground. Other filter topologies can be utilized for filter 166.

Figure 5:
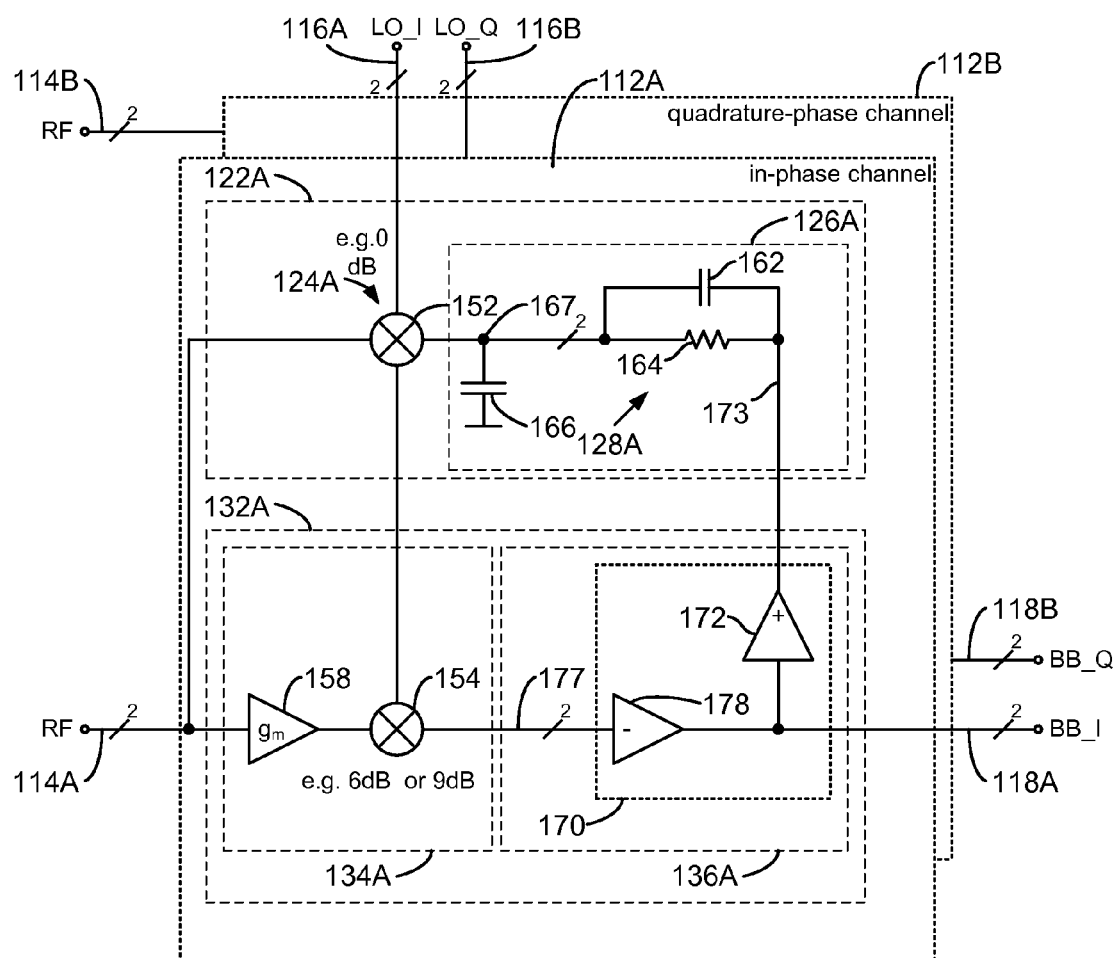
FIG. 5 is an electrical schematic drawing of the direct converter or demodulator illustrated in FIG. 1 in according to another embodiment.

With reference to FIG. 5, circuit 112A is similar to circuit 112A described with reference to FIG. 4. Circuit 112A in FIG. 5 can include operational amplifier stage 172 and an operational amplifier stage 178. An output of stage 178 can drive an input of stage 172 and output 118A. An output of stage 172 is coupled to a node 173 which is coupled to feedback network 128A. Stages 172 and 178 can be configured as inverting operational amplifiers.

The configuration of amplifier circuit 170 can be in a more directional mode than amplifier circuit 170 of FIG. 4 to reverse path isolation for low frequency on-channel distortion products or cancel low frequency cross talk over filter network associated with resistor 162 and capacitor 164 in one embodiment.

In one embodiment, stage 172 with current driving capabilities drives dominant parasitic impedance (capacitor 162 is not loading but parasitic to ground related to capacitor 162). Therefore, using one stage 178 to provide most of the voltage gain while driving the relatively high impedance of the stage 172 is feasible.

Filter 166 provides a built-in transferred impedance filter in feedback path 122A to provide filtering for high and in-band frequency offsets (e.g., transmitter offsets) in one embodiment. In these offsets, the feedback associated with stage 178 can be seen as a high impedance network. By forming a low impedance current path to filter network 128A, low frequency intermodulation products can be partially avoided at forward path 132A. Parallel order distortion products (e.g., IN2, IN4) and/or harmonic responses (ISR) associated with a mismatched environment in common mode are not necessarily properly filtered if circuitry fed by outputs 118A and 118B do not provide properly defined common mode impedance in one embodiment.

Figure 6:
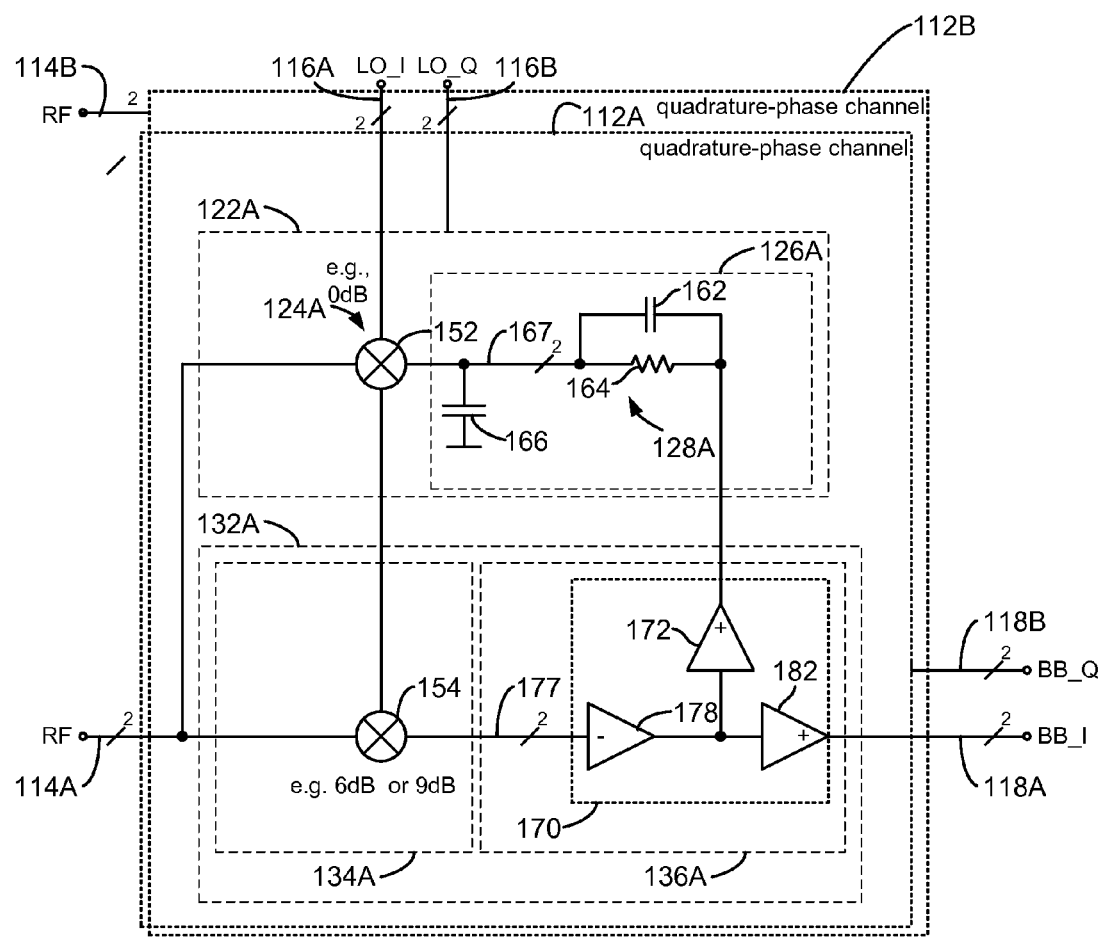
FIG. 6 is an electrical schematic drawing of the direct converter or demodulator illustrated in FIG. 1 according to another embodiment.

With reference to FIG. 6, circuit 112A is similar to circuit 112A discussed with reference to FIG. 5. Circuit 112A in FIG. 6 includes amplifier circuit 170 including stages 172, 178 and 182 in one embodiment. An output of stage 178 can be provided to an input of stage 172 and an input of stage 182. Stage 172 has on output coupled to node 173, and an output of stage 182 is coupled to output 118A in one embodiment. In one embodiment, stage 172 multiplies stage 182 according to loading impedance. Stages 178, 172, and 182 can be embodied as inverting operational amplifier stages.

Figure 7:
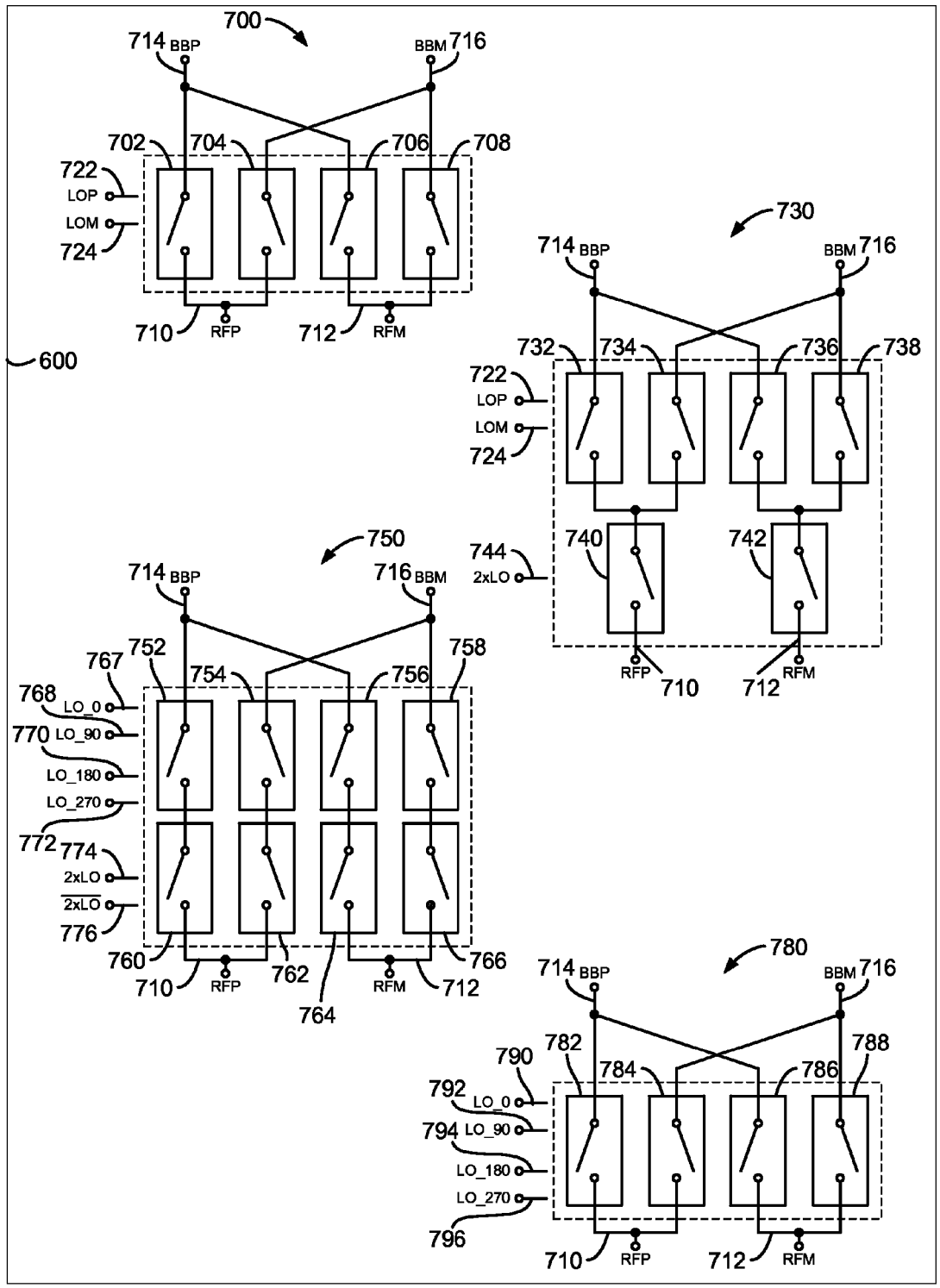
FIG. 7 is an electrical schematic drawing of four embodiments of mixer topologies for the direct converters illustrated in FIGS. 2-6.

With reference to FIG. 7, a set 600 of mixer topologies 700, 730, 750 and 780 can be utilized in circuit 12 or circuits 112 A, or 112B. Each of topology 700, 730, 750, or 780 can be utilized as a topology for any of mixers 152, 154, and 155. However, embodiments of mixers 152, 154, and 155 are not limited to topologies 700, 720, 750 and 780 in set 600 which are discussed in an exemplary non-limiting fashion. Topology 700 is a passive CMOS based topology with a 25% duty cycle in one embodiment. Topology 730 provides direct gating for local oscillator wave form shaping (e.g. 50 percent duty cycle local oscillator signal plus two times frequency local oscillator signal provide an overall pass function with a 25% duty cycle) in one embodiment. Topology 780 provides a reactive pass function (e.g., for inductorless or complex filter designs) in one embodiment. Topology 750 provides direct gating with reactive pass functions in one embodiment.

In one embodiment, mixer topology 700 can include four switches 702, 704, 706 and 708. Each of switches 702 and 704 has a node coupled to a positive radio frequency terminal 710, and each of switches 706 and 708 has a node coupled to a negative radio frequency output 712, in one embodiment. Outputs 710 and 712 correspond to a differential type input for radio frequency input 114A (FIGS. 2-6) in one embodiment.

Switches 702 and 706 can each include a node coupled to a positive baseband output 714, and switches 704 and 708 each can include a node coupled to a negative baseband terminal 716. Terminals 714 and 716 can correspond to a differential type of node 177 or node 167 (FIGS. 2-6).

A gate of switch 702 is coupled to a positive local oscillator input 722, and a gate of switch 704 is coupled to a negative local oscillator input 724 in one embodiment. A gate of switch 706 is coupled to a negative local oscillator input 724, and a gate of switch 708 is coupled to a positive local oscillator input 722 in one embodiment. Inputs 722 and 724 can correspond to a differential local oscillator input 116A. In one embodiment, switches 702 and 708 are controlled by a positive local oscillator signal and switches 704 and 706 are controlled by a negative local oscillator signal.

In one embodiment, topology 730 includes switches 732, 734, 736, 738, 740 and 742. Switches 732 and 738 can be controlled by local oscillator signals at input 722 and switches 734 and 736 are controlled by local oscillator signals input at 724. Switches 740 and 742 can be controlled via terminal 744 by a local oscillator signal at two times the frequency of the local oscillator sign provided to inputs 722 and 724 in one embodiment. Switches 732 and 736 have a node coupled to baseband terminal 714, and switches 734 and 738 have a node coupled baseband terminal 716. Switch 740 has a node coupled to terminal 710 and switch 742 has a node coupled to terminal 712. Switch 740 has a node coupled to switches 732 and 734. Switch 742 has a node coupled to switches 736 and 738.

In one embodiment, topology 750 includes switches 752, 754, 756, 758, 760, 762, 764 and 766. Switch 752 can be controlled by a local oscillator signal at a terminal 767. Switch 756 can be controlled by a 180 degree phase delayed local oscillator signal at a terminal 770. Switch 758 can be controlled by a 270 degree phase delayed local oscillator signal at a terminal 772, and switch 754 can be controlled by a 90 degree phase delayed local oscillator signal at a terminal 768. Switches 760 and 764 can be controlled by a two times frequency local oscillator signal at a terminal 774, and switches 762 and 766 can be controlled by an inverse of the two times frequency local oscillator signal at a terminal 776.

Switches 752 and 756 can have a node coupled to terminal 714. Switches 754 and 758 can have a node coupled to terminal 716. Switches 760 and 762 can have a node coupled to terminal 710, and switches 764 and 766 can have a node coupled to terminal 712. Switches 752 and 760 can be coupled in series in one embodiment. Switches 754 and 762 can be coupled in series in one embodiment. Switches 756 and 764 can be coupled in series in one embodiment, and switches 758 and 766 are coupled in series in one embodiment.

In one embodiment, topology 780 includes a switch 782, a switch 784, a switch 786 and a switch 788. Switch 782 is controlled by a local oscillator signal at a terminal 790, switch 788 is controlled by a 90 degree phase delayed local oscillator signal at a terminal 792, switch 784 is controlled by an inverse local oscillator signal at a terminal 794, and switch 786 is controlled by an inverse local oscillator signal delayed by 90 degrees at a terminal 796, in some embodiments. Switch 782 can be coupled between terminals 710 and 714. Switch 784 can be coupled between terminals 710 and 716. Switch 786 can be coupled between terminals 712 and 714. Switch 788 can be coupled between terminals 716 and 712.

Topologies and their use of local oscillator 700, 730, 750, and 78 signals are provided in an exemplary fashion. Various permeations of quadrature phase mixtures can be used for different reactive pass functions.

Figure 8:
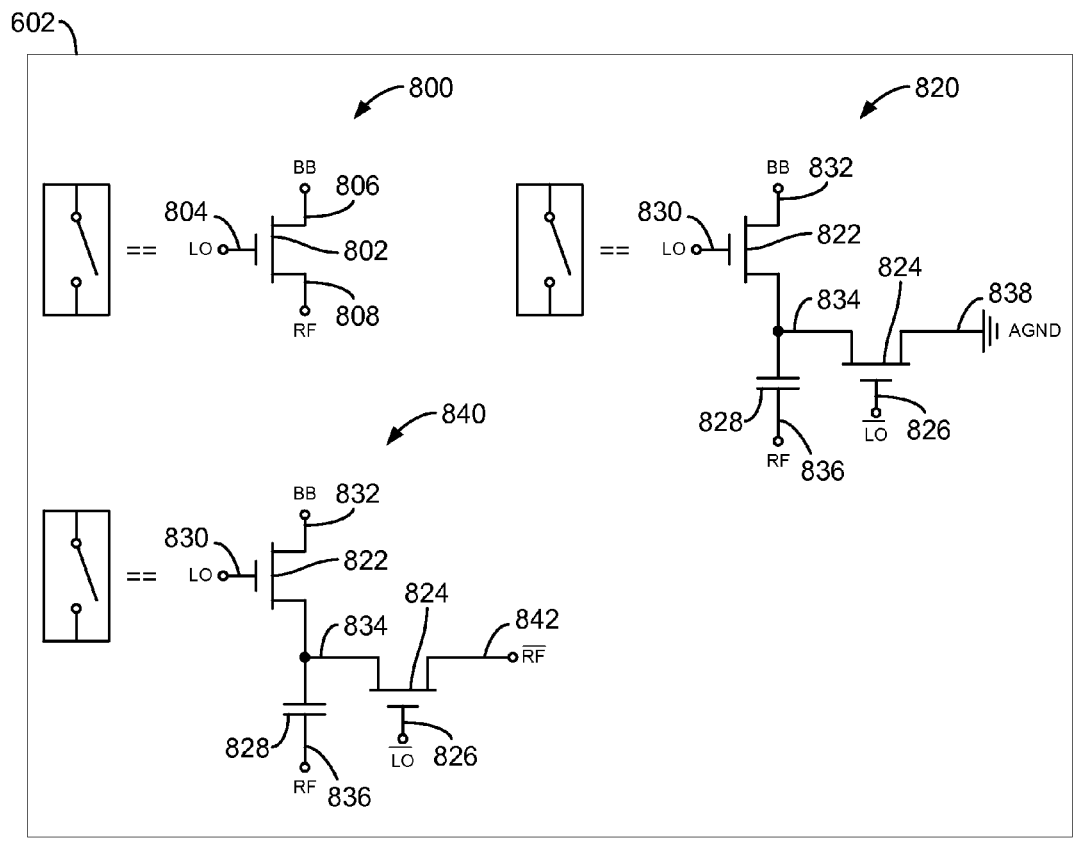
FIG. 8 is an electrical schematic drawing of four embodiments of switch functionalities for the mixer topologies illustrated in FIG. 7.

With reference to FIG. 8, a set 602 of switch functionalities 800, 820, and 840 can be utilized for switches in set 600 of mixer topologies 700, 730, 750, and 780 in one embodiment. Set 600 can include a switch functionality 800, a switch functionality 820, and a switch functionality 840. Switch functionality 800, switch functionality 820, switch functionality 840, can be field effect transistor-based functionalities. In one embodiment, any of switch functionality 800, switch functionality 820, and switch functionality 840 can be used as any of switches 702, 704, 706, 708, 732, 734, 736, 738, 740, 742, 752, 754, 756, 758, 760, 762, 764, 766, 782, 784, 786, and 788 described with respect to mixer topologies 700, 730, 750 and 780 in FIG. 7. However, switches 702, 704, 706, 708, 732, 734, 736, 738, 740, 742, 752, 754, 756, 758, 760, 762, 764, 766, 782, 784, 786, and 788 described with respect to mixer topologies 700, 730, 750 and 780 in FIG. 7 are not limited to being one of switch functionalities 800, 820, and 840.

Switch functionality 800 includes a transistor 802 with gate 804 for receiving local oscillator signal and a node 806 for a baseband signal and a node 808 for a radio frequency signal. Functionality 800 can be employed in topologies 700, 730, 750 and 780 where node 806 is coupled to one of baseband terminals 714 and 716 and node 808 is coupled to one of radio frequency terminals 710 or 712. Gate 804 of transistor 802 is coupled to one of terminals 722, 724, 744, 767, 770, 772, 774, 776, 790, 792, 794, and 796 depending upon the mixer topology and the placement of functionality 800 in that topology. When functionality 800 is employed in series with another functionality in topologies 730 or 750 (e.g., the pair of switches 732 and 740 or the pair switches 752, and 760), node 808 of transistor 802 with node 806 coupled to one of terminals 714 and 716 can be coupled to node 806 of transistor 802 with node 808 coupled to one of terminals 710 and 712.

Switch functionality 820 can include a capacitor 828, a transistor 822 and a transistor 824. Transistor 824 can include a gate 826 for receiving an inverse phase with same duty cycle of the local oscillator signal. Capacitor 828 can be disposed between a node 836 for radio frequency signal and a node 834 of transistor 824. A gate 830 of transistor 822 can be for receiving the local oscillator signal. A node 832 of transistor 822 can be for receiving a baseband signal. Transistor 822 can be coupled to transistor 824 and capacitor 828 at node 834. Signal ground or virtual signal ground for differential embodiments can be connected to a node 838 of transistor 824.

Functionality 820 can employed in topologies 700, 730, 750 and 780 where node 832 is coupled to one of baseband terminals 714 and 716 and node 836 is coupled to one of radio frequency terminals 710 or 712. Gate 830 of transistor 802 can be coupled to one of terminals 722, 724, 744, 767, 770, 772, 774, 776, 790, 792, 794, and 796 depending upon the mixer topology and the placement of functionality 820 in that topology. Gate 826 is coupled to an inverse phase of the local oscillator signal provided to gate 830. When functionality 820 is employed in series with another functionality 820 in topologies 730 or 750 (e.g., the pair of switches 732 and 740 or the pair of switches 752 and 760), node 836 of functionality 820 with node 832 coupled to one of terminals 714 and 716 can be coupled to node 832 of functionality 820 with node 836 coupled to one of terminals 710 and 712.

Switch functionality 840 is similar to switch functionality 820 with the same or similar interconnections. However, an inverse radio frequency signal can be provided to a node 842 of transistor 824. When functionality 840 is employed in topologies 700, 730, 750, and 780, node 842 can be coupled to one of terminals 710 and 712 and node 836 can be coupled to the other of terminals 710 and 712 depending upon the mixer topology and the placement of functionality 820 in that topology. Adjustments to functionality 840 can be made to accommodate the opposite phase radio frequency signal at node 842 when functionality 840 is used in topologies 730 and 750.

Figure 9:
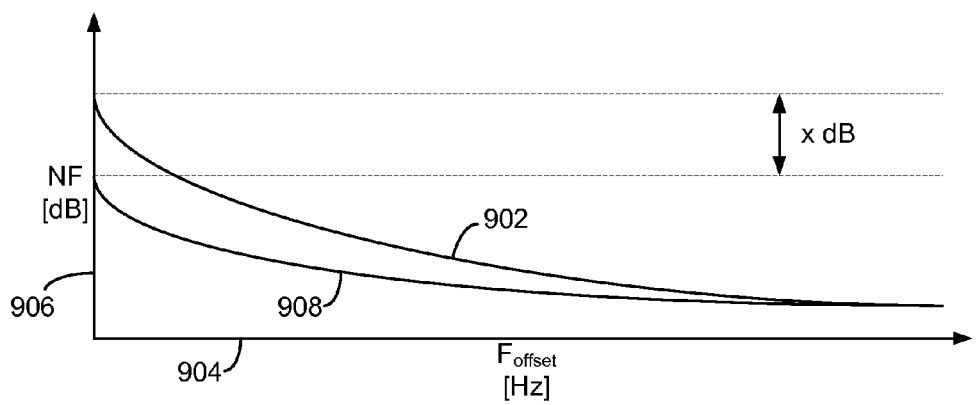
FIG. 9 is a graph showing noise performance versus radio frequency for the receivers illustrated in FIGS. 1-6.

With reference to FIG. 9, and in one embodiment, noise performance verses baseband/IF offset frequency is provided for receiver 10 employing circuit 12 and/or circuits 112A-B. A curve 902 provided an X axis 904 representing frequency and a Y axis 906 representing noise in dB shows noise performance for a frequency converter without gain in the mixer circuit. The frequency converter without gain in the mixer circuit can use a current mode mixer topology (e.g., topology 700) and a switching functionality 800. A curve 908 can represent noise performance of circuit 12, 112A, and or 112B using mixer 155. For curve 908, mixer 155 can have a mixer topology 700 with a switching functionality 820 providing a 6 dB gain or a mixer topology 700 with a switching topology 840 providing a 9 dB gain. For both curves 906 and 908, mixer 152 can have a zero dB gain and uses topology 700 and functionality 800. A comparison of curves 908 and 902 shows an X dB difference (e.g., in noise performance at low frequency levels), where X is 6 dB or 9 dB in one embodiment. The improved noise performance is achieved using the Cartesian topology according to one embodiment. At low frequency where flicker noise of baseband is dominating the overall noise performance, the Cartesian topology can receive the benefit of added open-loop gain.

Other permutations of mixer topologies 700, 730, 750 and 780 with switching topologies 800, 820, 840 and 860 are possible. For example, voltage gains for mixer 152 and 155 of 0 dB, 6 dB and 9 dB and regenerative and partial combinations for intermediate gain values can be achieved.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Embodiments of the invention may be employed in senders and/or receivers of network elements of a 3GPP network. They may be employed also in senders and/or receivers of other mobile networks such as CDMA, EDGE, UMTS, LTE, LTE-A, GSM, WLAN networks, etc., and also in other senders and/or receivers. In particular, they may be deployed in a terminal (terminal device, user equipment) of the respective technology which may be e.g. a mobile phone, a smart phone, a PDA, a laptop or any other terminal. Also, they may be deployed in base stations of the respective technology such as eNodeB, NodeB, BTS, Access Point etc.

Names of network elements, protocols, and methods are based on current standards. In other versions or other technologies, the names of these network elements and/or protocols and/or methods may be different, as long as they provide a corresponding functionality.

The figures show logical or functional structures of example embodiments. They are not intended to show an arrangement of the components on a circuit board, substrate, etc. I.e., the arrangement of the components may or may not correspond to the logical or functional structure.

If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware.

Implementations of any of the above described blocks, apparatuses, systems, techniques or methods include, as non-limiting examples, implementations as hardware, software, firmware, special purpose circuits or logic, general purpose hardware or controller or other computing devices, or some combination thereof.

Such hardware may be hardware type independent and may be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), etc., using for example ASIC (Application Specific IC (Integrated Circuit)) components, FPGA (Field-programmable Gate Arrays) components, CPLD (Complex Programmable Logic Device) components or DSP (Digital Signal Processor) components. MOS components (e.g. transistors) may be implemented in NMOS or PMOS technology. Different MOS components may be based on the same or different of these technologies.

A device/apparatus may be represented by a semiconductor chip, a chipset, or a (hardware) module comprising such chip or chipset; this, however, does not exclude the possibility that a functionality of a device/apparatus or module, instead of being hardware implemented, be implemented as software in a (software) module such as a computer program or a computer program product comprising executable software code portions for execution/being run on a processor. A device may be regarded as a device/apparatus or as an assembly of more than one device/apparatus, whether functionally in cooperation with each other or functionally independently of each other. The components of a device may be in a same device housing or in different device housings.

For example, method steps may be implemented in software, firmware, or hardware, in the latter case using any known or future developed hardware technology or any hybrids of these, as described hereinabove. The method steps may be implemented in a mixture of software, firmware, and hardware.

Various embodiments of user equipment may include, but are not limited to, mobile stations, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

As used in this application, the term "circuitry" refers at least to all of the following:
a) to hardware-only circuit implementations (such as implementations in only analog and/or digital circuitry), and
b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions), and
c) to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

It is to be understood that what is described above is what is presently considered the preferred embodiments of the present invention. However, it should be noted that the description of the preferred embodiments is given by way of example only and that various modifications may be made without departing from the scope of the invention as defined by the appended claims. That is, the above embodiments are to be understood as illustrative examples of the invention. Further embodiments of the invention are envisaged.

What is claimed is:

1. An apparatus, comprising:
a forward mixer path comprising an amplifier, a first mixer, a first input, a second input, and a first output, the forward mixer path configured to receive a first radio frequency signal at the first input, receive an oscillator signal at the second input and provide a baseband signal, the first mixer being configured to receive the oscillator signal, the first mixer configured to down convert the first radio frequency signal and provide a gain, the amplifier being configured to receive the baseband signal and provide an output signal at the first output; and
a feedback mixer path comprising a second mixer, a filter, and a resistor capacitor network tuned to a baseband frequency, the feedback mixer path being configured to receive the output signal at the first output and provide a second radio frequency signal at the first input, the second mixer being configured to receive the oscillator signal, wherein the filter is coupled to a node between the resistor-capacitor network and the second mixer.

2. The apparatus of claim 1, wherein the resistor-capacitor network is disposed between the first output and the second mixer.

3. The apparatus of claim 2, wherein the filter is configured to block high frequency blockers associated with oscillator signals.

4. The apparatus of claim 1, wherein the second mixer is configured to provide a gain different than the gain of the first mixer.

5. The apparatus of claim 1, wherein the first mixer comprises a voltage mode mixer core.

6. The apparatus of claim 1, wherein the second mixer is configured to provide a gain less than the gain of the first mixer.

7. The apparatus of claim 1, wherein the second mixer comprises a mixer core configured in a passive 25 percent or less duty cycle topology with four switching functionalities, each of the switching functionalities comprising one transistor.

8. The apparatus of claim 1, wherein the amplifier is disposed between the first output and the first mixer.

9. An apparatus, comprising:
a forward mixer path comprising an amplifier, a first mixer, a first input, a second input, and a first output, the forward mixer path configured to receive a first radio frequency signal at the first input, receive an oscillator signal at the second input and provide a baseband signal, the first mixer being configured to receive the oscillator signal, the first mixer configured to down convert the first radio frequency signal and provide a gain, the amplifier being configured to receive the baseband signal and provide an output signal at the first output; and
a feedback mixer path comprising a second mixer, the feedback mixer path being configured to receive the output signal at the first output and provide a second radio frequency signal at the first input, the second mixer being configured to receive the oscillator signal, wherein the first mixer comprises a voltage mode mixer core configured in a passive 25 percent or less duty cycle topology with four switching functionalities, each of the switching functionalities comprising two transistors, and a capacitor.

10. A method of processing a radio frequency signal, the method comprising:
using a voltage mode mixer core in a forward mixer path to down convert the radio frequency signal to a baseband signal and provide a voltage gain, wherein the voltage gain is characteristic of the voltage mode mixer core;

using a feedback mixer path comprising a second mixer core to correct overall gain; and blocking high frequency blockers associated with oscillator signals using a first filter at an interface between the second mixer core and a second filter in the feedback mixer path.

11. A method of processing a radio frequency signal, the method comprising:

using a voltage mode mixer core in a forward mixer path to down convert the radio frequency signal to a baseband signal and provide a voltage gain;

using a feedback mixer path comprising a second mixer core to correct overall gain; and filtering at an interface between a resistive capacitive network in the feedback mixer path and the second mixer core.

12. The method of claim 11 wherein the voltage mode mixer core and the second mixer core provide a low impedance input for the radio frequency signal.

13. The method of claim 11 further comprising:

providing an interface between an amplifier in the forward mixer path and the voltage mode mixer core, the interface being direct current decoupled.

14. The method of claim 13 wherein the interface is configured to allow a common mode level to be chosen to optimize noise performance.

15. The method of claim 11, further comprising:

filtering at an interface between an amplifier in the forward mixer path and the voltage mode mixer core, the interface being direct current decoupled.

16. A frequency converter for a path, comprising:

an amplifier, a first mixer, the first mixer and the amplifier being disposed between a first input and a first output;

a resistive-capacitive network;

a second mixer, the second mixer and the resistive capacitive network being disposed between the first input and the first output, the first mixer being configure to provide open loop gain and frequency down conversion; and a filter disposed at a node between the resistive capacitive network and the second mixer.

17. The frequency converter of claim 16, wherein the frequency converter is employed in a quadrature phase channel or an in-phase channel.

18. The frequency converter of claim 17 further comprising:

an input for receiving a local oscillator signal, wherein the first mixer and the second mixer receive the local oscillator signal.

19. The frequency converter of claim 17 wherein the amplifier comprises an amplifier having a first stage coupled between the first mixer and the first output, and a second stage coupled between the first output and the second mixer.

20. A frequency converter, comprising:

an amplifier, a first mixer, the first mixer and the amplifier being disposed between a first input and a first output;

a resistive-capacitive network; and a second mixer, the second mixer and the resistive capacitive network being disposed between the first input and the first output, the first mixer being configure to provide open loop gain and frequency down conversion, wherein the amplifier comprises an amplifier having a first stage, a second stage and a third stage, the first stage being coupled between the first mixer and the second stage, the second stage being coupled between the first output and the first stage, the third stage being coupled between the second mixer and a node, the node being between the first stage and the second stage.

* * * * *